US006819706B1

United States Patent
Lim (10) Patent No.: US 6,819,706 B1
(45) Date of Patent: Nov. 16, 2004

(54) CONTROL DEVICE FOR CONTROLLING POWER LEVEL BETWEEN FREQUENCY ASSIGNMENT IN RADIO FREQUENCY RECEIVING DEVICE OF MOBILE RADIO COMMUNICATION BASE STATION SYSTEM IN CDMA SYSTEM

(75) Inventor: Doo Roo Lim, Inchon (KR)

(73) Assignee: Hyundai Electronics Ind. Co., Ltd., Kyoungki-Do (KR)

( * ) Notice: Subject to any disclaimer, the term of this patent is extended or adjusted under 35 U.S.C. 154(b) by 783 days.

(21) Appl. No.: 09/633,404

(22) Filed: Aug. 7, 2000

(30) Foreign Application Priority Data

Sep. 13, 1999 (KR) .............................. 99-39092

(51) Int. Cl.[7] .............................. H04B 1/69; H04B 1/10; H04L 27/06; H04L 27/08
(52) U.S. Cl. ...................... 375/130; 375/316; 375/345; 375/349
(58) Field of Search .................................. 375/130, 136, 375/144, 147, 148, 316, 344, 345, 346, 350, 275, 152, 153, 340, 349

(56) References Cited

U.S. PATENT DOCUMENTS 5,321,849 A * 6/1994 Lemson .................... 455/67.11
6,411,825 B1 * 6/2002 Csapo et al. ................. 455/561
6,480,528 B1 * 11/2002 Patel et al. .................. 375/148

* cited by examiner

Primary Examiner—Young T. Tse
Assistant Examiner—Sam K. Ahn
(74) Attorney, Agent, or Firm—Charles T. J. Weigell; Bryan Cave LLP (57) ABSTRACT

Disclosed is a control device for controlling power level between frequency assignment in an RF receiving device of a mobile radio communication base station system in a CDMA system capable of lowering the power level of the frequency assignment signal having a relatively high power difference, after the detection of the power level by the frequency assignment, to thereby minimize the power level difference between the frequency assignment and then, executing an AGC for three frequency assignment, whereby the performance deterioration of the whole channels, which is caused due to the disappearance of the frequency assignment signal having a relatively low power difference by the frequency assignment having the high power difference, can be prevented.

5 Claims, 6 Drawing Sheets

CONTROL DEVICE FOR CONTROLLING POWER LEVEL BETWEEN FREQUENCY ASSIGNMENT IN RADIO FREQUENCY RECEIVING DEVICE OF MOBILE RADIO COMMUNICATION BASE STATION SYSTEM IN CDMA SYSTEM

BACKGROUND OF THE INVENTION

1. Field of the Invention

The present invention relates to a radio frequency (hereinafter, referred to simply as RF) receiving device of a mobile radio communication base station system in a CDMA (code division multiple access) system.

More particularly, the present invention relates to a control device for controlling power level between frequency assignment, in an RF receiving device of a mobile radio communication base station system in a CDMA system which down-converts an RF received signal into intermediate frequency signals for three frequency assignment, converts the down-converted three frequency assignment IF signals into digital signals, and executes a QPSK (quadrature phase shifting keying) demodulation and a channel filtering for each frequency assignment in a digital manner, whereby it prevents the performance deterioration of all channels due to the power level difference between the frequency assignment.

2. Discussion of Related Art

A general mobile radio communication base station system in a CDMA system includes a switching system and a cell equipment. Of course, the above system contains a large number of functional devices which are all embodied with various kinds of equipments.

The key part of the mobile radio communication base station system is composed of a channel card, a sector interface card, an analog common card and a digital shelf on which a terminal card is packaged. Additionally, it contains a tranceiver shelf which up-converts an IF signal outputted from the digital shelf in an ultra high frequency (UHF) signal and reversely, down-converts the UHF signal into the IF signal. In the tranceiver shelf the sector interface card is installed to couple baseband forward signals received from the channel cards and up-convert the coupled signal into the IF signal. The sector interface card receives the coupled baseband transmitting signals coupled from the analog common cards and couples and amplifies the received signals. The coupled signal is coupled, through a low-pass filter (LPF), to the IF signal, i.e., the delayed signal by the phase of 0° and 90° of 4.95 MHz and transmitted as the IF signal of 4.95 MHz, through a band-pass filter (BPF), to an RF rack. Therefore, the RF rack converts the received IF signal of 4.95 MHz into the UHF signal, for transmitting the converted signal through an antenna.

Now, an explanation of the construction and operation of the general mobile radio communication base station system will be discussed.

Figure 1:
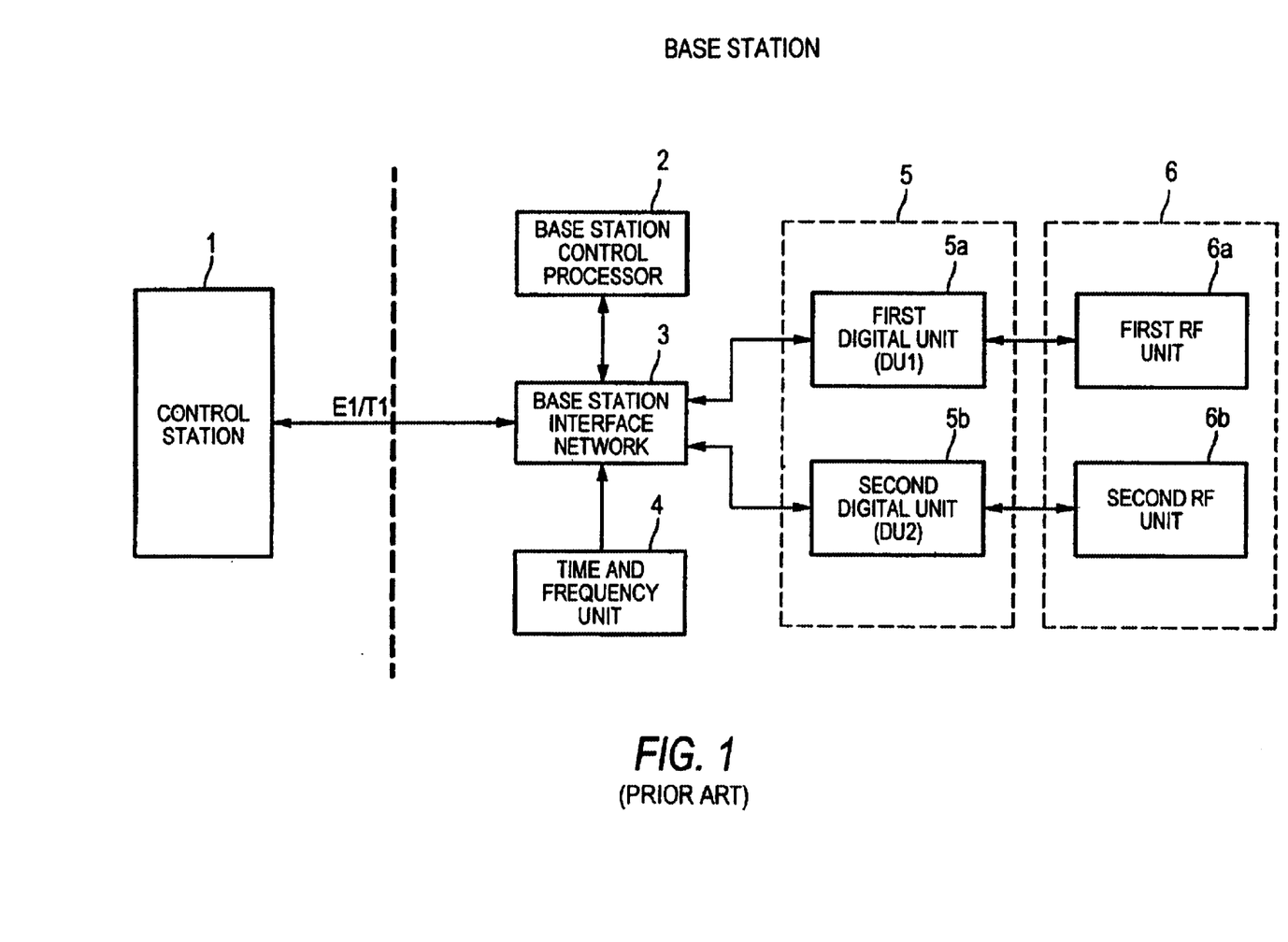
FIG. 1 is a block diagram illustrating the construction of a general mobile radio communication base station system.

FIG. 1 is a block diagram illustrating the construction of a general mobile radio communication base station system. In construction, the system comprises: a base station control processor (BCP) 2 which operates and controls one base station; a base station interconnection network (BIN) 3 which serves as a packet router between the base station and a control station 1 via a line E1 or T1 and interfaces high-level data link control (HDLC) packet data between the processors within the base station; a time and frequency unit (TFU) 4 which generates a reference frequency and a timing synchronizing signal to thereby execute the synchronization for each processor within the base station and the timing synchronization with an adjacent base station; a digital unit (DU) 5 composed of a first digital unit 5a and a second digital unit 5b, which modulates/demodulates the data signal and voice signal transmitted/received through a CDMA channel; and an RF unit (RFU) 6 composed of a first RF unit 6a and a second RF unit 6b, which converts an UHF signal received from a mobile station into an IF signal to thereby transmit the converted IF signal to the digital unit 5, receives the IF signal inputted from the digital unit 5 to thereby convert the received IF signal into the UHF signal, and amplifies the converted UHF signal to a predetermined level to thereby execute space-radiation for the amplified UHF signal. The RF unit 6 is divided into an RF receiving device and an RF transmitting device.

Figure 2:
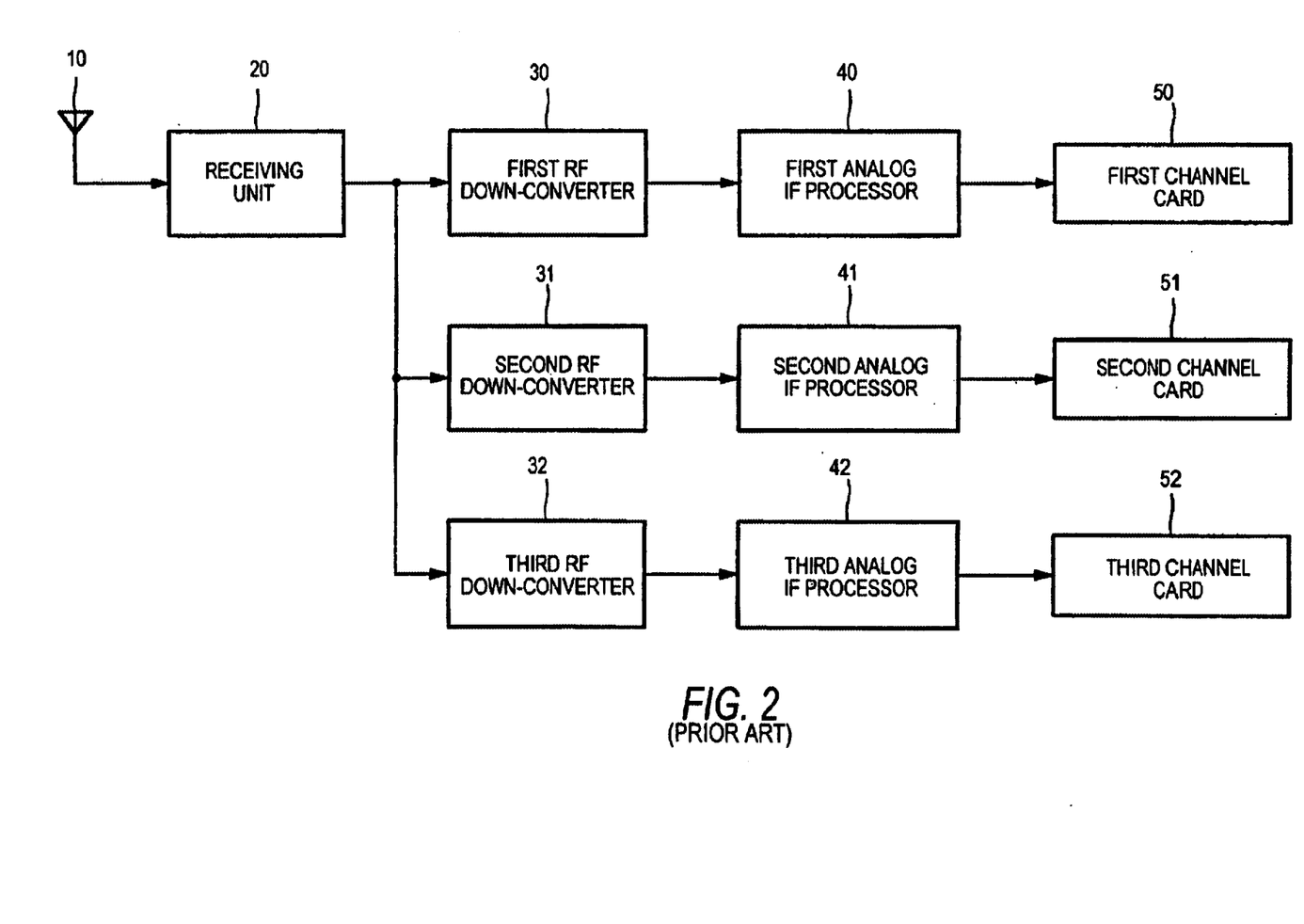
FIG. 2 is a block diagram illustrating the construction of a prior art RF receiving device of a mobile radio communication base station system in a CDMA system.

Under the general mobile radio communication base station system in the CDMA system, the construction of a prior art RF receiving device is shown in FIG. 2.

As shown, the conventional RF receiving device includes an RF receiving antenna 10, a receiving unit 20, first to third RF down-converters 30, 31 and 32 by frequency assignment, first to third analog IF processors 40, 41 and 42 by frequency assignment, and first to third channel cards 50, 51 and 52 by frequency assignment.

The antenna 10 and the receiving unit 20 are used commonly for all frequency assignment and the first to third RF down-converters 30, 31 and 32 and the first to third analog IF processors 40, 41 and 42 are used by each frequency assignment. And, each of the first to third channel cards 50, 51 and 52 is used by one or more by frequency assignment. For instance, the RF receiving device in the CDMA system supporting four frequency assignment includes one antenna, one receiving unit, four RF down-converters, four analog IF processors, and four or more channel cards.

Now, an explanation of the operation of the prior art RF receiving device supporting the three frequency assignment will be discussed.

First, the receiving unit 20 receives the RF signal received from the antenna 10, limits the band of the received signal by using a band-pass filter (which is not shown in the drawing), amplifies the filtered signal to a predetermined level by means of a linear noise amplifier (which is not shown in the drawing), and outputs the amplified RF signal to the first to third down-converters 30, 31 and 32, respectively. The first to third down-converters 30, 31 and 32 receive the RF signal from the receiving unit 20, down-convert the received RF signals into IF signals by using two-stage mixer and local oscillator (which are not shown in the drawing), and output the down-converted frequency assignment IF signals to the first to third analog IF processors 40, 41 and 42. In other words, each of the first to third down-converters 30, 31 and 32 primarily down-converts the received RF signal into the IF signal of about 70 MHz through the local oscillator and mixer at the first stage and secondarily down-converts the received IF signal of 70 MHz into the IF signal of 4.95 MHz through the local oscillator and mixer at the second stage. At the same time, each of the first to third down-converters 30, 31 and 32 limits the band of the down-converted IF signal by using an SAW filter having the pass band of 1.25 MHz corresponding to the bandwidth of frequency assignment 1FA. The first to third analog IF processors 40, 41 and 42 receive the down-converted IF signals outputted from the first to third RF down-converters 30, 31 and 32, divide the received signals into the signals on I/Q channels to down-convert the signals on the I/Q channels into baseband signals, execute a quadrature phase shifting keying (QPSK) demodulation for each of the baseband signals, and convert the analog baseband signals on the I/Q channels into digital signals. And, the first to third analog IF processors 40, 41 and 42 execute multiplexing for the digital baseband signals on the I/Q channels and transmit the multiplexed signals to the first to third channel cards 50, 51 and 52. The first to third channel cards 50, 51 and 52 receive the multiplexed digital baseband signals on the I/Q channels by each frequency assignment and execute a CDMA demodulation for each of the received signals by the frequency assignment.

However, the above conventional RF receiving device of the mobile radio communication base station system in the CDMA system suffers from problems that the extension of system is carried out by one frequency assignment, because the RF down-converter and the analog IF processor are used by each frequency assignment, that the size of the base station system as well as the RF receiving device system is bulky, because three RF down-converters and three analog IF processors are required for processing the three frequency assignment, and that the expense increases, because of the large size.

Figure 3:
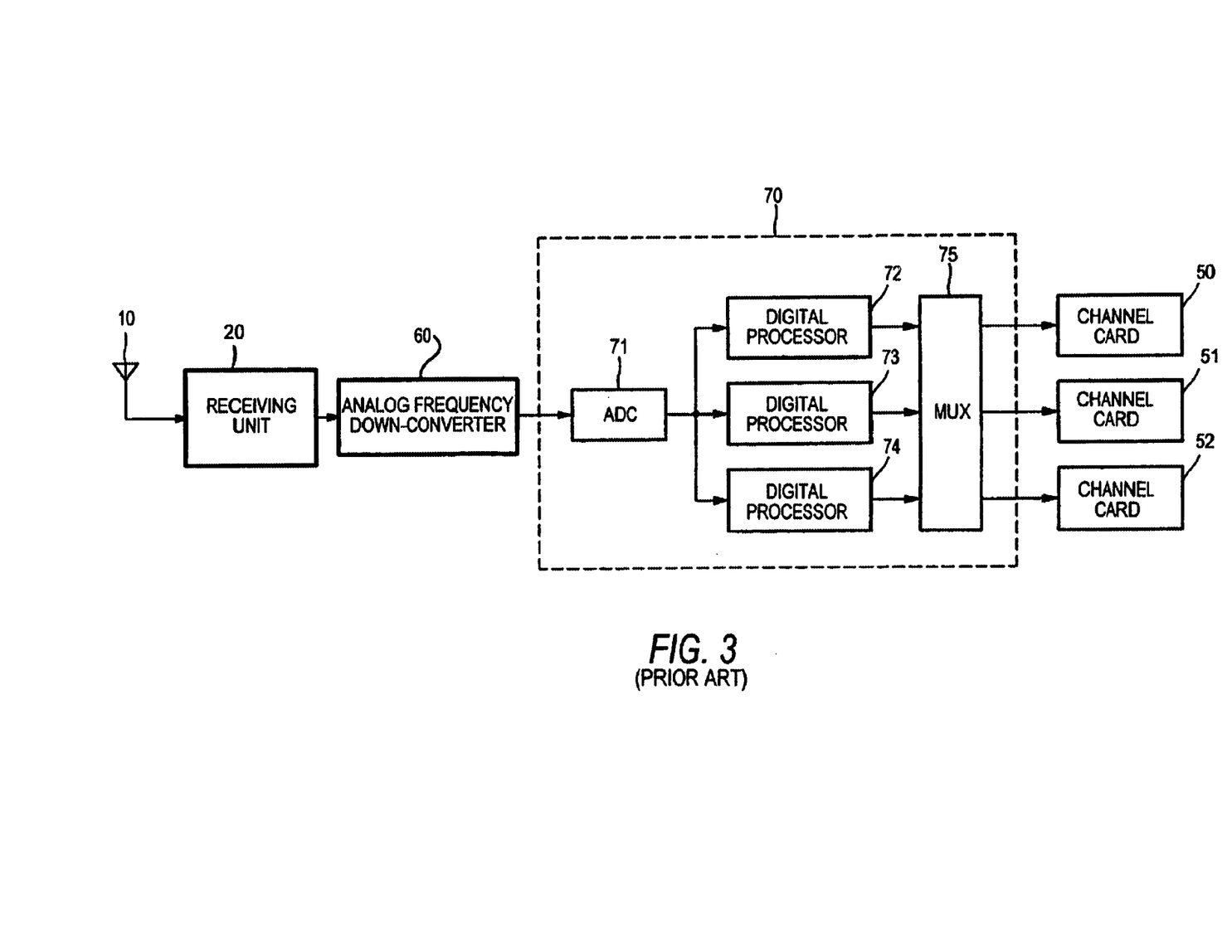
FIG. 3 is a block diagram illustrating the construction of another prior art RF receiving device of the mobile radio communication base station system in the CDMA system.

To overcome these problems, another prior art digital RF receiving device of the mobile radio communication base station system in the CDMA system is shown in FIG. 3.

As shown, the above conventional digital RF receiving device includes: a receiving unit 20 for receiving the RF signal received via the antenna 10 from a mobile terminal device, limiting the band of the received signal, and amplifying the filtered signal to a predetermined level; an analog frequency down-converter 60 for down-converting the multi-carrier (three frequency assignment) RF signal outputted from the receiving unit 20 into arbitrary IF signals; and a digital frequency down-converter 70 for converting the IF signals for the three frequency assignment outputted from the analog frequency down-converter 60 into digital signals, dividing the converted digital signals into the signals on I/Q channels to down-convert the signals on the I/Q channels into baseband signals, and outputting the baseband signals on the I/Q channels by each frequency assignment to channel cards 50, 51 and 52 corresponding to each frequency assignment.

In the above construction, the analog frequency down-converter 60 comprises a local oscillator (which is not shown in the drawing) for generating an arbitrary local frequency, a mixer (which is not shown in the drawing) for mixing the local frequency generated in the local oscillator and the three frequency assignment RF signal to thereby output the three frequency assignment IF signal, and a wide band SAW filter (which is not shown in the drawing) for limiting the band of the three frequency assignment IF signal to the pass-band of the bandwidth corresponding to the three frequency assignment bandwidth. In this case, the IF is roughly 70 MHz and the bandwidth of the SAW filter is 3.75 MHz corresponding to the three frequency assignment. At this time, the reason why the bandwidth for the three frequency assignment is 3.75 MHz that the interval between the frequency assignment is 1.25 MHz. The digital frequency down-converter 70 comprises an A/D converter 71 for converting the band-limited IF signal outputted from the analog frequency down-converter 60 into the digital signal, a plurality of digital processors 72 to 74 for dividing the digital signal outputted from the A/D converter 71 into the signals on the I/Q channels by each frequency assignment, executing the QPSK demodulation for the divided I/Q channel signals and down-converting the demodulated signals into the baseband signals, and a multiplexor 75 for multiplexing the baseband signals on the I/Q channels for each frequency assignment outputted from the plurality of digital processors 72 to 74 to thereby output the multiplexed signals to the channel cards 50, 51 and 52 corresponding to the three frequency assignment. In this case, the baseband signals outputted from the digital processor 72 are the I/Q channel baseband signals for the frequency assignment 0FA, the baseband signals from the digital processor 73 are the I/Q channel baseband signals for the frequency assignment 1FA, and the baseband signals from the digital processor 72 are the I/Q channel baseband signals for the frequency assignment 2FA. At this time, each of the digital processors 72 to 74 comprises a channel divider (which is not shown in the drawing) for dividing the digital signal outputted from the A/D converter 71 into the I/Q channel signals, a local oscillator (which is not shown in the drawing) for generating an arbitrary local frequency, a mixer (which is not shown in the drawing) for mixing the local frequency generated in the local oscillator and each of the divided I/Q channel signals to thereby convert the mixed signal into the baseband signals on the I/Q channels, and a digital FIR filter (which is not shown in the drawing) for filtering the I/Q channel baseband signals by the frequency assignment outputted from the mixer and limiting the band of the filtered baseband signals to thereby output the band-limited baseband signals to the multiplexor 75.

Now, an explanation of the operation of the another prior art RF receiving device will be discussed.

First, the receiving unit 20 receives the three frequency assignment RF signal received from the antenna 10, limits the band of the received signal by using a band-pass filter provided therein, amplifies the filtered signal to a predetermined level by means of a linear noise amplifier (which is not shown in the drawing), and outputs the amplified RF signal to the analog frequency down-converter 60. The analog frequency down-converter 60 receives the RF signal from the receiving unit 20, down-converts the received RF signals into the IF signal of 70 MHz by using a mixer at a first stage, and outputs the down-converted frequency assignment IF signal to the A/D converter 71 of the digital frequency down-converter 70. In other words, if the three frequency assignment RF signal outputted from the receiving unit 20 is inputted to the mixer of the analog frequency down-converter 60, the mixer mixes the local frequency generated from the local oscillator and the three frequency assignment RF signal outputted from the receiving unit 20 and down-converts the mixed signal into the IF signal of 70 MHz. Then, the SAW filter, which has the pass-band of 3.75 MHz corresponding to the three frequency assignment, limits the band of the down-converted IF signal of 70 MHz and the band limited IF signal is outputted to the A/D converter 71 of the digital frequency down-converter 70. The IF signal outputted from the analog frequency down-converter 60 is converted into the digital signal in the A/D converter 71 of the digital frequency down-converter and then inputted to the three digital processors 72 to 74 for the three frequency assignment. Therefore, the digital processors 72, 73 and 74 execute the QPSK demodulation to divide the digital signals for the three frequency assignment into the I/Q channel signals and to down-convert the divided I/Q channel signals into the baseband signals on the I/Q channels. Then, the digital processors 72, 73 and 74 limit the band of the demodulated I/Q channel baseband signals for each frequency assignment through the digital FIR filter and output the I/Q channel baseband signals for each frequency assignment to the multiplexor 75. As a result, the digital processor 72 outputs the baseband signals on the I/Q channels for the frequency assignment 0FA, the digital processor 73 outputs the baseband signals on the I/Q channels for the frequency assignment 1FA, and the digital processor 74 outputs the baseband signals on the I/Q channels for the frequency assignment 2FA. Next, the multiplexor 75 executes the multiplexing for the baseband signals on the I/Q channels for the frequency assignment 0FA outputted from the digital processor 72 to thereby output the multiplexed signal to the channel card 50 for the frequency assignment 0FA, executes the multiplexing for the baseband signals on the I/Q channels for the frequency assignment 1FA outputted from the digital processor 73 to thereby output the multiplexed signal to the channel card 51 for the frequency assignment 1FA, and executes multiplexing for the baseband signals on the I/Q channels for the frequency assignment 2FA outputted from the digital processor 74 to thereby output the multiplexed signal to the channel card 52 for the frequency assignment 2FA. Each of the channel cards 50, 51 and 52 executes the CDMA demodulation for the inputted I/Q channel signals. As a result, the another prior art RF receiving device of the mobile radio communication base station system in the CDMA system replaces the plurality of RF down-converters and analog IF processors with the analog frequency down-converter 60 for outputting the IF signal of 70 MHz having the bandwidth corresponding to the multi-frequency assignment and the digital frequency down-converter 70 for converting the IF signal of 70 MHz into the digital signals through the A/D conversion, thereby making it possible to extend the frequency assignment by the multi-frequency assignment (three frequency assignment).

Figure 4A:
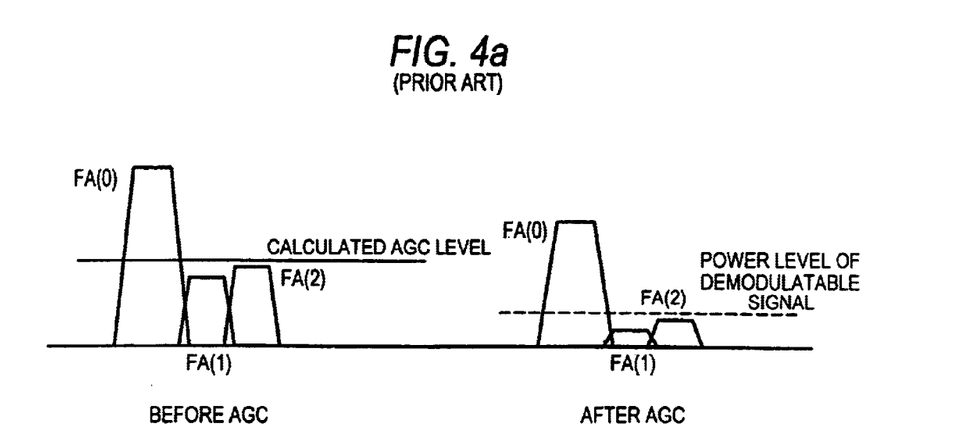
FIG. 4a is an exemplary view illustrating the signal level for each frequency assignment before automatic gain control (AGC) in a multi-carrier signal.
Figure 4B:
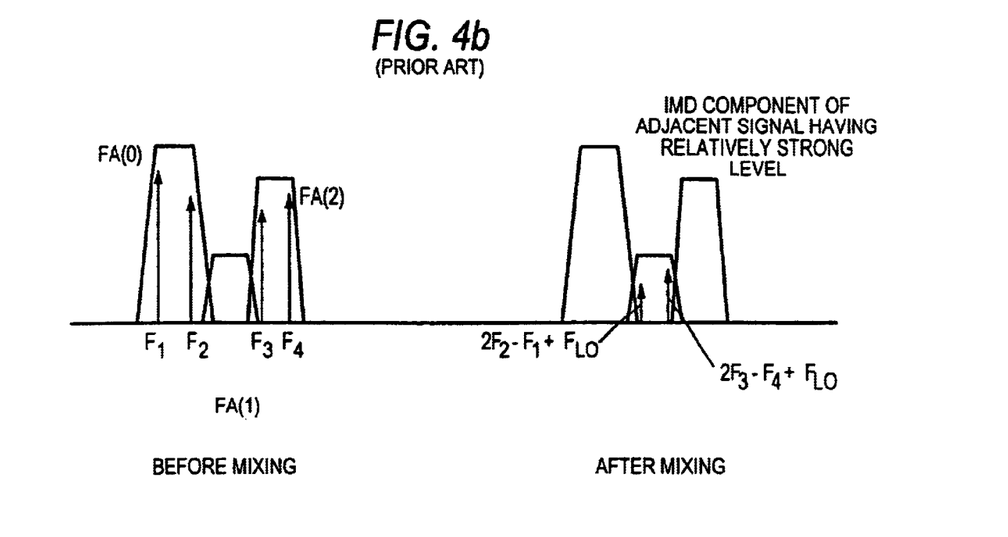
FIG. 4b is an exemplary view illustrating the signal level for each frequency assignment after the AGC.

However, in the conventional RF receiving device where the multi-carrier (three frequency assignment) is processed at a time, when the power level difference by the frequency assignment is high due to the drastic variation of the subscribers or the generation of the spurious, as shown in FIG. 4a, the automatic gain control (AGC) in the analog frequency down-converter 60 does not operate normally. Since an AGC adjusting value in the AGC is calculated with the power level sensing value for the whole three frequency assignment, the frequency assignment signals having relatively low power level difference (the FA(1) and FA(2) in FIG. 4a) become disappear by the frequency assignment signal having a high power level difference (the FA(0) in FIG. 4a) through the AGC process. By estimating the signal power difference for each frequency assignment and by discriminating each frequency assignment, therefore, the AGC should be carried out. On the other hand, when the three frequency assignment signals exist after the AGC but the power level difference therebetween is generated, as shown in FIG. 4b, since the analog frequency down-converter 60 down-converts the signal having the three frequency assignment bandwidth (3.75 MHz), it is a possibility that a serious inter modulation distortion can be generated. The inter modulation distortion means that the frequency assignment signal having a relatively low power level (the FA(1) in FIG. 4b) to which the frequency assignment signals having relatively high power level (the FA(0) and FA(2) in FIG. 4b) flow becomes disappear. That is, in case where the high power level difference between the frequency assignment is generated, the performance deterioration for all channels is experienced. Therefore, there is a need to propose a new RF receiving device for preventing the performance deterioration for all channels caused due to the high power level difference between the frequency assignment.

SUMMARY OF THE INVENTION

An object of the invention is to provide a control device for controlling power level between frequency assignment in an RF receiving device of a mobile radio communication base station system in a CDMA system which is capable of lowering the power level of the frequency assignment signal having a relatively high power difference, if the power difference by the frequency assignment is high under the detection of the power level by the frequency assignment, to thereby minimize the power level difference between the frequency assignment, and then, executing an AGC process for the three frequency assignment, whereby the disappearance of the frequency assignment signal having a relatively low power difference caused by the frequency assignment having a high power difference can be prevented.

To accomplish this and other objects of the present invention, there is provided a control device for controlling power level between frequency assignment, in an RF receiving device of a mobile radio communication base station system in a CDMA system having an analog frequency down-converter for down-converting an RF signal outputted from a receiving unit into an IF signal and a digital frequency down-converter for converting the down-converted IF signal in the analog frequency down-converter into a digital IF signal and down-converting the digital IF signal into baseband signals for each frequency assignment to thereby output the baseband signals to corresponding channel cards, which comprises: a microcontroller for receiving the power level values for the baseband signals of each frequency assignment down-converted in the digital frequency down-converter to thereby determine a power level difference between the frequency assignment and selecting one frequency assignment signal having a relatively high power level difference to thereby generate an attenuation control signal attenuating the power of the selected frequency assignment signal; an IF analog processor for attenuating the power of the frequency assignment signal having the relatively high power level difference in the three frequency assignment signals obtained in the analog frequency down-converter in accordance with the attenuating control signal generated from the microcontroller and adding the IF signals for the frequency assignment to thereby output the added signal as the IF signal for the three frequency assignment; an automatic gain controller for determining an AGC value in accordance with the power level of the IF signals outputted from a plurality of digital processors for the frequency assignment within the digital frequency down-converter to thereby output the AGC value; and a gain controller for controlling the gain of the IF signals for the three frequency assignment outputted from the IF analog processor in accordance with the AGC value outputted from the automatic gain controller to thereby transmit the gain controlled three frequency assignment signal to the digital frequency down-converter.

DETAILED DESCRIPTION OF PREFERRED EMBODIMENT

Hereinafter, an explanation of the construction and operation of a control device for controlling power level between frequency assignment in an RF receiving device of a mobile radio communication base station system in a CDMA system according to the present invention will be in detail discussed with reference to FIGS. 5 and 6.

Figure 5:
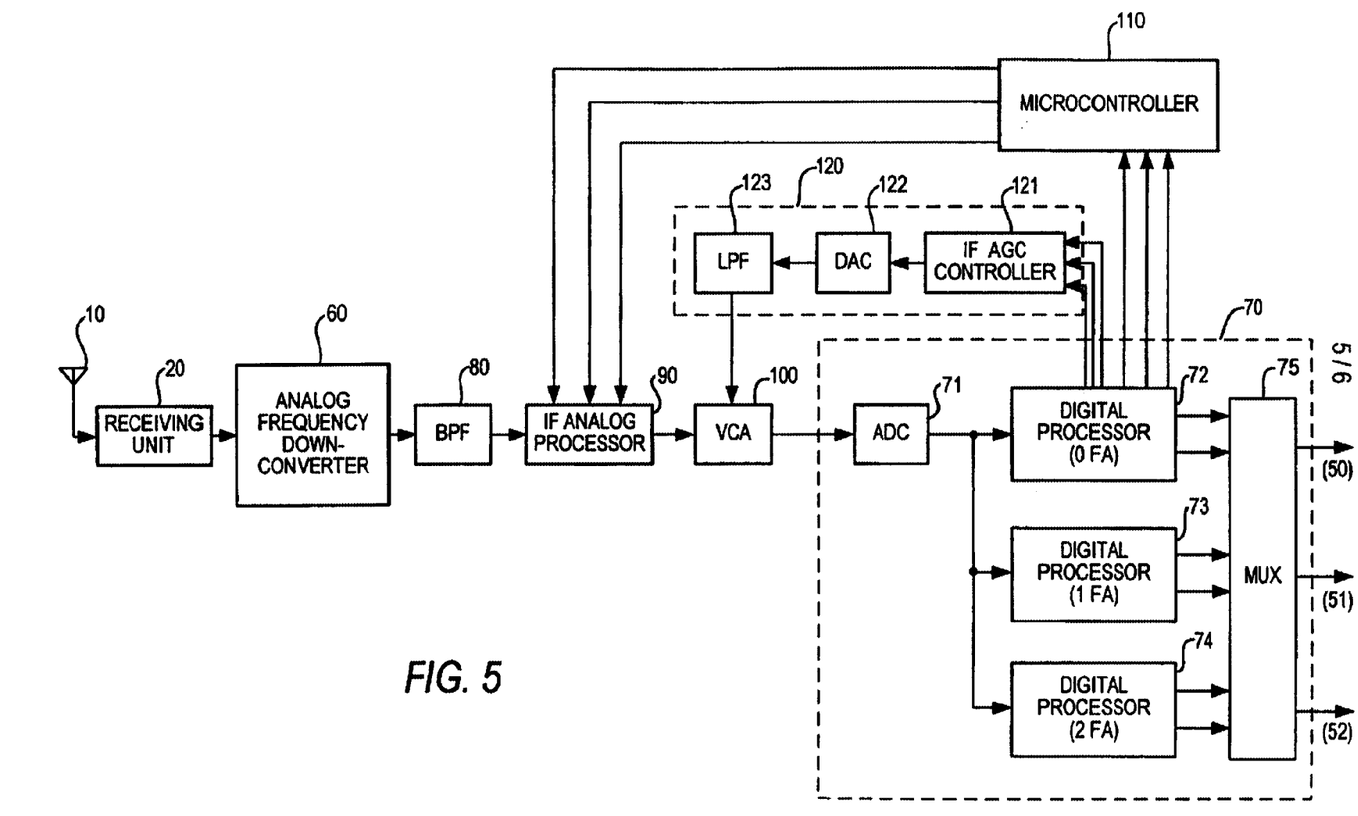
FIG. 5 is a block diagram illustrating the construction of a control device for controlling power level between frequency assignment in an RF receiving device of a mobile radio communication base station system in a CDMA system according to the present invention.
Figure 6:
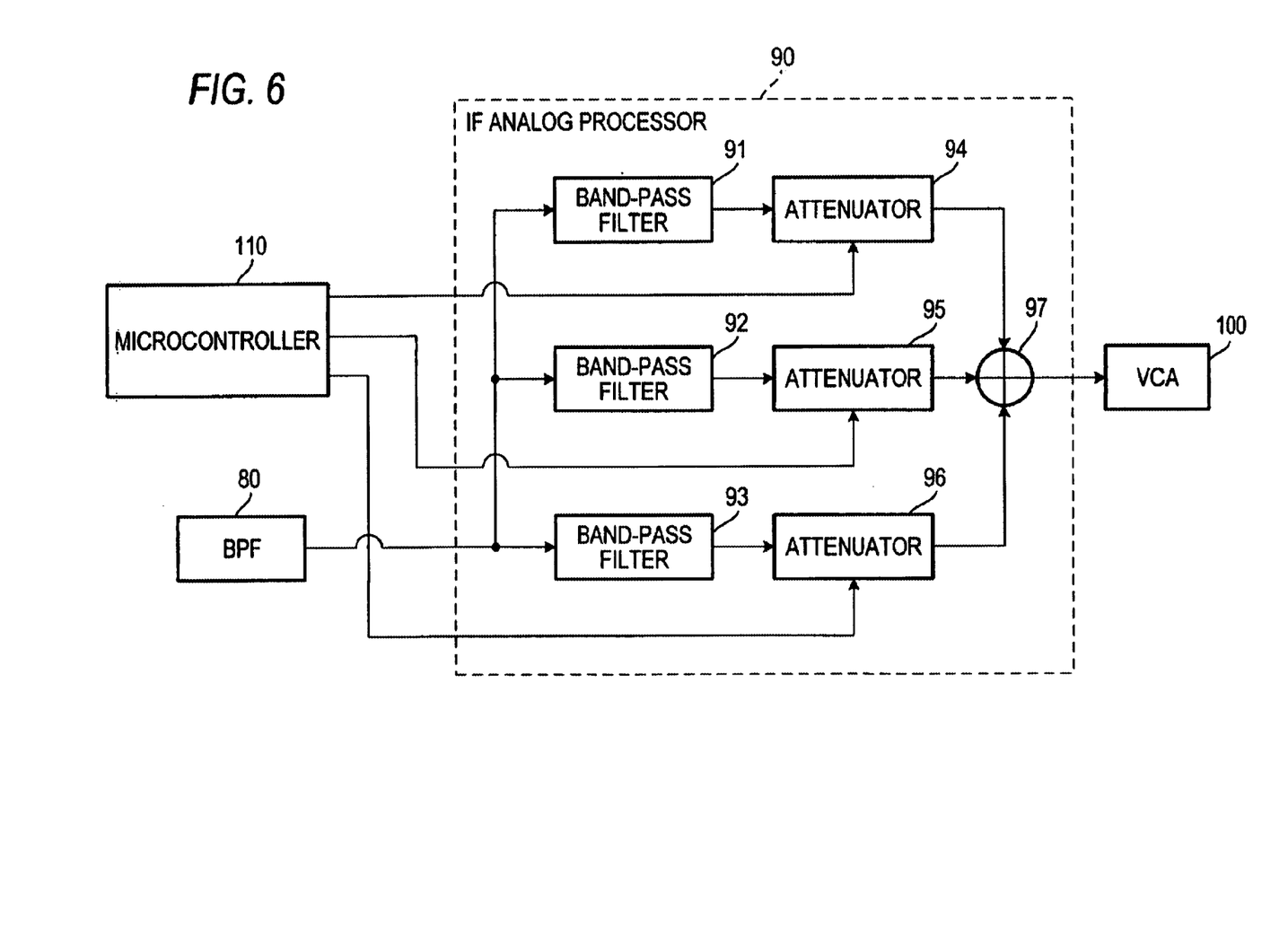
FIG. 6 is an exemplary view illustrating the preferred embodiment of the IF analog processor in FIG. 5.

FIG. 5 is a block diagram illustrating the construction of a control device for controlling power level between frequency assignment in an RF receiving device of a mobile radio communication base station system in a CDMA system according to the present invention.

The construction and operation of the antenna 10, analog frequency down-converter 60, digital frequency down-converter 70 and channel cards 50, 51 and 52 in FIG. 5 are the same as in FIG. 3.

As shown, the control device for controlling power level between frequency assignment further includes: a band-pass filter 80 for filtering only the signal corresponding to the frequency band of the three frequency assignment outputted from the analog frequency down-converter 60; a microcontroller 110 for receiving the power level value for the baseband signals of each frequency assignment down-converted in the digital frequency down-converter 70 to thereby determine the power level difference between the frequency assignment and selecting one frequency assignment signal having a relatively high power level difference to thereby generate an attenuation control signal attenuating the power of the selected frequency assignment signal; an IF analog processor 90 for attenuating the power of the frequency assignment signal having the relatively high power level difference in the three frequency assignment signals obtained in the band-pass filter 80 in accordance with the attenuating control signal generated from the microcontroller 110 and adding the IF signals for the frequency assignment to thereby output the added signal as the IF signal for the three frequency assignment; an automatic gain controller 120 for determining an AGC value in accordance with the power level of the IF signals outputted from a plurality of digital processors 72, 73 and 74 for the frequency assignment within the digital frequency down-converter 70 to thereby output the AGC value; and a voltage controlled amplifier 100 for controlling the gain of the IF signals for the three frequency assignment outputted from the IF analog processor 90 in accordance with the AGC value outputted from the automatic gain controller 120 to thereby transmit the gain controlled three frequency assignment signal to the digital frequency down-converter 70. The IF analog processor 90 comprises, as shown in FIG. 6, band-pass filters 91, 92 and 93 by the frequency assignment for filtering the IF signal having the bandwidth of the three frequency assignment outputted from the band-pass filter 80 to the bandwidth of the corresponding frequency assignment (0FA, 1FA, and 2FA), attenuators 94, 95 and 96 by the frequency assignment for attenuating the IF signals for the frequency assignment filtered in the band-pass filters 91, 92 and 93 in accordance with the attenuation control signal generated in the microcontroller 110, and an adder 97 for adding the attenuated IF signals to output the added signal to the voltage controlled amplifier 100. In this case, the band-pass filter 91 filters only the signal of the frequency assignment 0FA, the band-pass filter 92 filters only the signal of the frequency assignment 1FA, and the band-pass filter 93 filters only the signal of the frequency assignment 2FA. If the attenuation control signal for attenuating only the power level of the corresponding frequency assignment signal having the relatively high power level is generated from the microcontroller 110, only the attenuator of the corresponding frequency assignment having the high power level increases its attenuation rate to lower the power level of the corresponding frequency assignment and the attenuators of other frequency assignment decrease their attenuation rate. On the other hand, if the power level difference is not high, the attenuators 94, 95 and 96 all decrease their attenuation rate and output the frequency assignment signals to the adder 97, without any attenuation.

Now, an explanation of the operation of the control device for controlling power level between frequency assignment in the RF receiving device of the mobile radio communication base station system in the CDMA system according to the present invention will be discussed.

First, the down-converted three frequency assignment IF signal in the analog frequency down-converter 60 is filtered to the IF signal having the three frequency assignment bandwidth in the band-pass filter 80, and the filtered three frequency assignment IF signal is inputted to the band-pass filters 91, 92 and 93 of the IF analog processor, respectively. The band-pass filter 91 filters only the signal for the frequency assignment 0FA to output the filtered signal to the attenuator 94 corresponding to the frequency assignment 0FA, the band-pass filter 92 filters only the signal for the frequency assignment 1FA to output the filtered signal to the attenuator 95 corresponding to the frequency assignment 1FA, and the band-pass filter 93 filters only the signal for the frequency assignment 2FA to output the filtered signal to the attenuator 96 corresponding to the frequency assignment 2FA. The IF signals for the frequency assignment outputted from the band-pass filters 91, 92 and 93 are attenuated at a predetermined attenuation rate in the attenuators 94, 95 and 96 and then outputted to the adder 97. The adder 97 adds the signals for the three frequency assignment outputted from the attenuators 94, 95 and 96 and outputs the added signal to the voltage controlled amplifier 100. At this time, the voltage controlled amplifier 100 executes the voltage control amplification, that is, AGC for the three frequency assignment signal outputted from the adder 97 of the IF analog processor 90 in accordance with the AGC signal generated from the automatic gain controller 120 and outputs the AGC-processed three frequency assignment signal to an A/D converter 71 of the digital frequency down-converter 70. The A/D converter 71 converts the inputted three frequency analog IF signal into the digital signal and outputs the converted digital signal to the digital processors 72, 73 and 74, respectively. The digital processors 72, 73 and 74 divide the digital signal outputted from the A/D converter 71 into the I/Q channel signals for each frequency assignment, execute the QPSK demodulation for the I/Q channel signals to down-convert the demodulated signals into the baseband signals, and output the down-converted baseband signals for each frequency assignment to the microcontroller 110 and a multiplexor 75, respectively. The microcontroller 110 determines the power level difference between the frequency assignment outputted from the digital processors 72, 73 and 74. If it is determined that the power difference between the frequency assignment is high, the microcontroller 110 selects the frequency assignment having a relatively high power level in the power level for each frequency assignment outputted from the digital processors 72, 73 and 74 and provides the attenuation control signal having a high attenuation rate to the selected frequency assignment and the attenuation control signal having a relatively low attenuation rate to other frequency assignment, thereby selectively outputting the attenuation control signal to the attenuators 94, 95 and 96 of the IF analog processor. The power level of the corresponding frequency assignment having the relatively high power level decreases in the attenuator of the corresponding frequency assignment, and the output signals in the attenuators 94, 95 and 96 are added in the adder 97 and outputted to the voltage controlled amplifier 100.

On the other hand, the digital frequency down-converter 70 outputs the power level value for each frequency assignment to the automatic gain controller 120 and an IF AGC controller 121 within the automatic gain controller 120 determines the AGC value by using the power level for each frequency assignment outputted from the digital processors 72, 73 and 74 and outputs the determined AGC value as the digital signal. Then, a D/A converter 122 converts the digital AGC value into an analog AGC signal and inputs the analog AGC signal to a low-pass filter 123. The low-pass filter 123 filters the analog AGC signal to remove a high frequency component therefrom and transmits the filtered signal to the voltage controlled amplifier 100. As a result, the voltage controlled amplifier 100 executes the AGC process for the three frequency assignment IF power signal outputted from the adder 97 of the IF analog processor 90 by using the AGC signal provided from the low-pass filter 123.

In short, the control device for controlling power level between frequency assignment in the RF receiving device in the mobile radio communication base station system in the CDMA system according to the present invention can determine the frequency assignment having a relatively high power level in the multi-carrier (three frequency assignment), select the frequency assignment having the relatively high power level by using the power level signals for the frequency assignment outputted from the digital processors 72, 73 and 74, and transmit the attenuation control signal for increasing the attenuation rate of the attenuator (94, 95 or 96) for the frequency assignment having the relatively high power level to the corresponding attenuator, under the control of the microcontroller 110. In this case, the signal which passes through the corresponding attenuator has a low power level, such that the three frequency assignment signals added in the adder 97 have a minimum power difference therebetween. Therefore, the AGC process in the IF stage can operate normally.

As clearly appreciated from the above, a control device for controlling power level between frequency assignment in an RF receiving device of a mobile radio communication base station system in a CDMA system according to the present invention is capable of lowering the power level of the frequency assignment signal having a relatively high power difference, after the detection of the power level by the frequency assignment, to thereby minimize the power level difference between the frequency assignment and then, executing an AGC for three frequency assignment, whereby the performance deterioration of the whole channels, which is caused due to the disappearance of the frequency assignment signal having a relatively low power difference by the frequency assignment having the high power difference, can be completely prevented.

What is claimed is:

1. A control device for controlling a power level between frequency assignment in an RF receiving device of a mobile radio communication base station system in a CDMA system having an analog frequency down-converter for down-converting an RF signal outputted from a receiving unit into an IF signal and a digital frequency down-converter for converting the down-converted IF signal in said analog frequency down-converter into a digital IF signal and down-converting the digital IF signal into baseband signals for each frequency assignment to thereby output the baseband signals to corresponding channel cards, said control device comprising:

a microcontroller for receiving power level values for the baseband signals of each frequency assignment down-converted in said digital frequency down-converter to thereby determine a power level difference between the frequency assignment and selecting one frequency assignment signal having a relatively high power level difference to thereby generate an attenuation control signal attenuating the power level of the selected frequency assignment signal;

an IF analog processor for attenuating the power level of the selected frequency assignment signal having the relatively high power level difference in three frequency assignment signals obtained in said analog frequency down-converter in accordance with said attenuating control signal generated from said microcontroller and adding the IF signals of each of the frequency assignment to thereby output the added IF signals as the IF signal for the three frequency assignment signals;

an automatic gain controller for determining an AGC value in accordance with the power level of the baseband signals outputted from a plurality of digital processors for the frequency assignment within said digital frequency down-converter to thereby output the AGC value; and a gain controller for controlling the gain of the IF signal for the three frequency assignment signals outputted from said IF analog processor in accordance with the AGC value outputted from said automatic gain controller to thereby transmit a gain controlled three frequency assignment signal to said digital frequency down-converter.

2. The control device as claimed in claim 1, further comprising a band-pass filter for filtering only the band frequency of the multi-frequency assignment IF signal outputted from said analog frequency down-converter to thereby output a filtered IF signal to said IF analog processor.

3. The control device as claimed in claim 2, wherein said IF analog processor comprises a plurality of band-pass filters by the frequency assignment for filtering the IF signal having the bandwidth of the three frequency assignment signals outputted from said band-pass filter to the bandwidth of the corresponding frequency assignment, a plurality of attenuators by the frequency assignment for attenuating the IF signal for the frequency assignment filtered in said plurality of band-pass filters in accordance with the attenuation control signal generated in said microcontroller, and an adder for adding the attenuated IF signals to output the added signal to said gain controller.

4. The control device as claimed in claim 1, wherein said automatic gain controller comprises an IF AGC controller for determining the AGC value by using the power level for each frequency assignment signal outputted from said digital frequency down-converter, a D/A converter for converting the AGC value determined in said IF AGC controller into an analog AGC signal, and a low-pass filter for filtering the analog AGC signal to remove a high frequency component therefrom and transmitting the filtered AGC signal to said gain controller.

5. The control device as claimed in claim 1, wherein said gain controller comprises a voltage controlled amplifier which controls the gain of the IF signal for the three frequency assignment signals outputted from said IF analog processor in accordance with the AGC value oupututted from said automatic gain controller.

* * * * *